(12) United States Patent
Brisotto et al.

(10) Patent No.: US 10,623,210 B2
(45) Date of Patent: Apr. 14, 2020

(54) TRANSMISSION SYSTEM OF AN ELECTRICAL SIGNAL

(71) Applicant: MARELLI AUTOMOTIVE LIGHTING ITALY S.P.A., Turin (IT)

(72) Inventors: Alessandro Brisotto, Turin (IT); Giancarlo Codutti, Turin (IT); Andrea Englaro, Turin (IT); Matteo Iellina, Turin (IT)

(73) Assignee: MARELLI AUTOMOTIVE LIGHTING ITALY S.P.A., Turin (IT)

( * ) Notice: Subject to any disclaimer, the term of this patent is extended or adjusted under 35 U.S.C. 154(b) by 0 days.

(21) Appl. No.: 16/209,200

(22) Filed: Dec. 4, 2018

(65) Prior Publication Data

US 2019/0182078 A1    Jun. 13, 2019

(30) Foreign Application Priority Data

Dec. 7, 2017    (IT) .................. 102017000141773

(51) Int. Cl.
*H04L 25/02* (2006.01)
*H03F 1/32* (2006.01)
*H04L 25/08* (2006.01)
*H04L 5/20* (2006.01)
*H04L 25/49* (2006.01)

(52) U.S. Cl.
CPC ........ *H04L 25/0278* (2013.01); *H03F 1/3211* (2013.01); *H04L 5/20* (2013.01); *H04L 25/028* (2013.01); *H04L 25/085* (2013.01); *H04L 25/4902* (2013.01); *H03F 2200/372* (2013.01)

(58) Field of Classification Search
CPC .. H04L 25/0278; H04L 25/028; H03F 1/3211; H03F 2200/372
USPC .......................................................... 326/30
See application file for complete search history.

(56) References Cited

U.S. PATENT DOCUMENTS

| | | | |
|---|---|---|---|
| 5,915,989 A | 6/1999 | Adriaenssens et al. | |
| 2001/0004558 A1 | 6/2001 | Broadhurst | |
| 2011/0158011 A1* | 6/2011 | Oh | G11C 7/02 365/194 |
| 2012/0299480 A1* | 11/2012 | Peting | H05B 33/0815 315/113 |
| 2014/0359242 A1* | 12/2014 | Son | G06F 13/1689 711/167 |

OTHER PUBLICATIONS

Search Report issued for Italian Patent Application No. 201700141773 dated Aug. 22, 2018.

* cited by examiner

*Primary Examiner* — Don P Le
(74) *Attorney, Agent, or Firm* — Howard & Howard Attorneys PLLC

(57) ABSTRACT

A transmission system of at least one electrical signal to be transmitted by a transmitting electronic device to at least a receiving electronic device, comprising: at least one signal line which connects the transmitting electronic device to the at least one receiving electronic device and which is suitable to transmit the respective electrical signal to be transmitted; a signal generation unit, that generates the electrical signal to be transmitted on each signal line; at least one noise compensation line; a noise compensation circuit that generates on each noise compensation line a noise compensation signal.

23 Claims, 14 Drawing Sheets

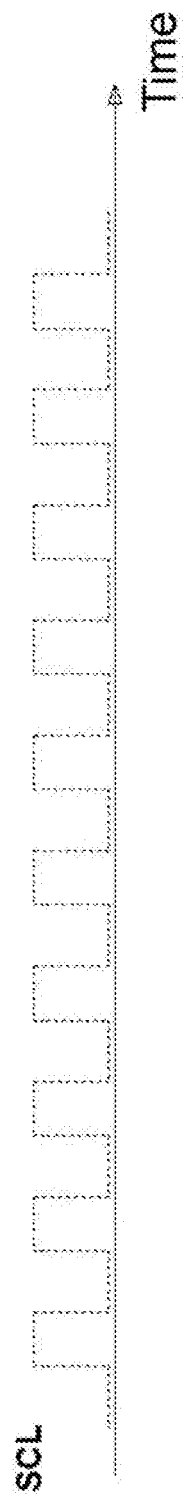
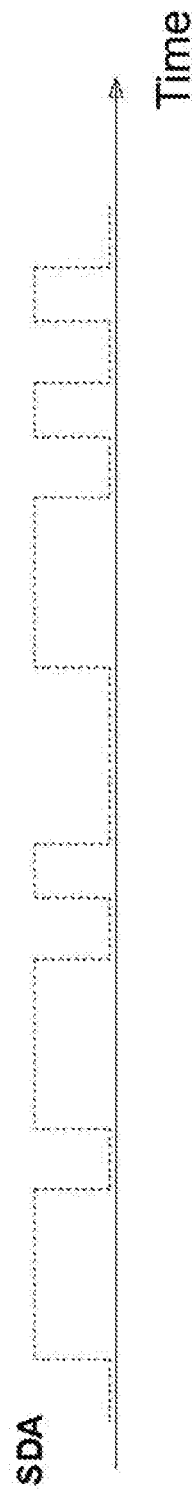

| $V_{SDA}$ | $V_{SCL}$ | Q1 | Q2 | $V_{OUT}$ | $V_{SCL\_OUT}$ | $V_{SDA\_OUT}$ |
|---|---|---|---|---|---|---|
| 0 | 0 | Cut-out | Cut-out | $V_{BATT}$ | 0 | 0 |
| 0 | 5 | Linear | Cut-out | $V_{BATT}-V_{SCL}+0.7$ | $V_{SCL}-0.7$ | 0 |
| 5 | 0 | Cut-out | Linear | $V_{BATT}-V_{SDA}+0.7$ | 0 | 5 |
| 5 | 5 | Linear | Linear | $V_{BATT}-V_{SCL}-V_{SDA}+1.4$ | $V_{SCL}-0.7$ | 5 |

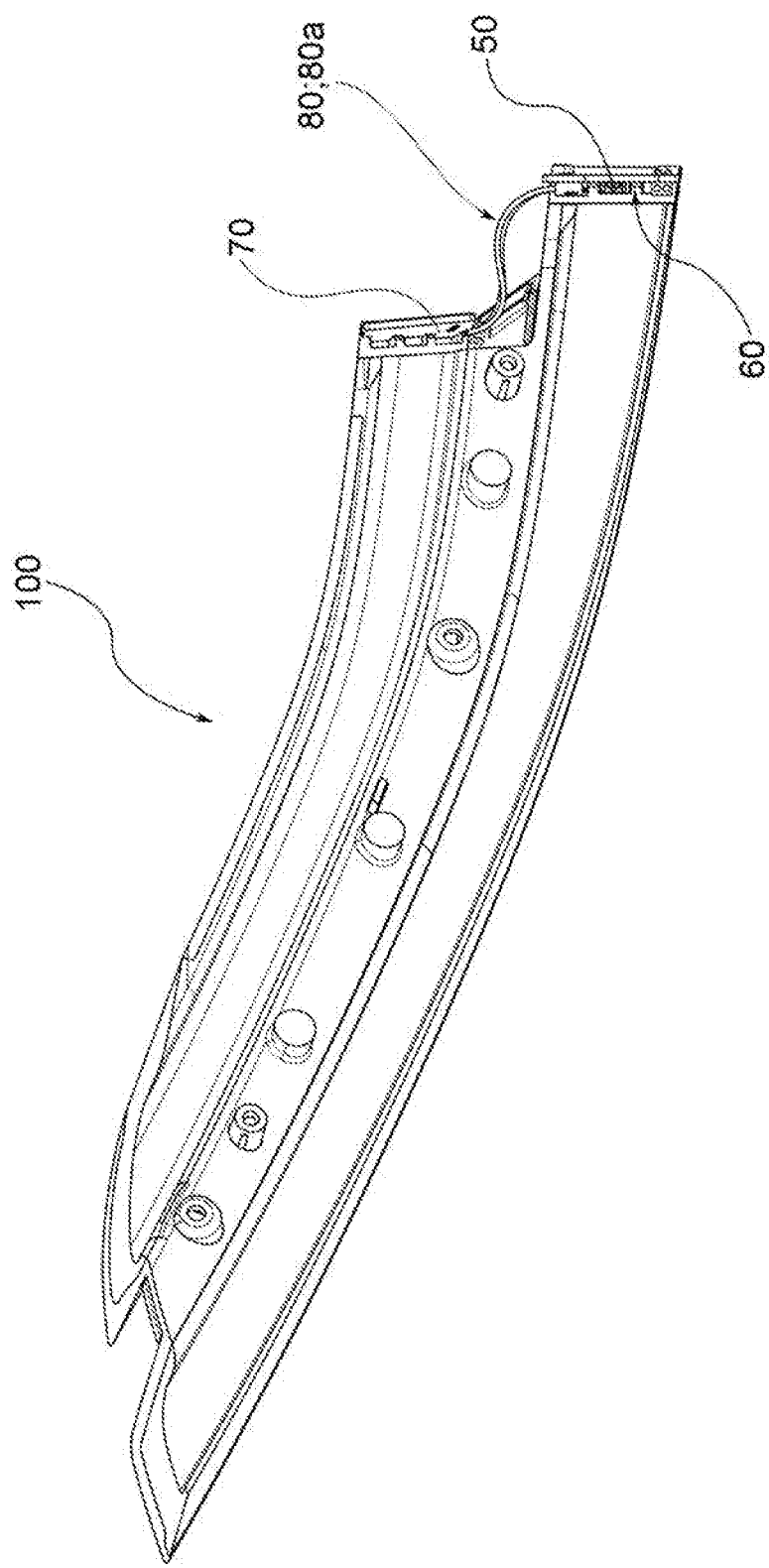

TRANSMISSION SYSTEM OF AN ELECTRICAL SIGNAL

CROSS-REFERENCE TO RELATED APPLICATIONS

The present application claims priority to and all the benefits of Italian Patent Application No. 102017000141773, filed on Dec. 7, 2017, which is hereby expressly incorporated herein by reference in its entirety.

BACKGROUND OF THE INVENTION

1. Field of the Invention

The present invention relates to a transmission system of an electrical signal to be transmitted between two electronic devices, where the electrical signal has a frequency spectrum which comprises a noise component formed by harmonics suitable to generate electromagnetic disturbances.

For example, the electrical signal to be transmitted is a signal having at least one variable component over time.

In a particular embodiment, the electrical signal is a data signal of a digital bus.

2. Description of the Related Art

As is known, a digital communication bus is formed of several cables, or wires, of a certain length, which can assume two different voltage values corresponding to two logic states, for example "0" and "1". For example, the logic state "0" is represented by a voltage of 0V, while the logic state "1" is represented by a voltage of 5V.

Generally speaking, a digital communication bus comprises a power cable, which assumes a constant voltage, an earth cable, which is also constant voltage, at least one data line, the voltage signal of which is a wave, such as a square wave, variable depending on the information to be transmitted. Some digital communication buses also include a clock line, the voltage signal of which is a constant square wave.

For example, the square waves of the clock line and the data line switch between a positive voltage, for example 5V, and the earth voltage, which serves as a common reference for the voltages of the electronic devices.

As is known, signals varying over time have a spectrum that contains high frequency harmonics capable of generating electromagnetic noise that can interfere with the operation of nearby electronic devices.

A possible solution to this problem is represented by filtering these harmonics. However, in some cases, such as in a vehicle light with LED light sources, the use of filters results in an unacceptable increase in costs.

Another known solution is to divide the signal to be transmitted into two opposing components, which correspond to the respective transmission conductors, so that the emissions generated by each component compensate the emissions generated by the other component. The two signal components must be recombined at the receiver device in order to obtain the original signal.

This solution, also known as "differential communication," has the obvious disadvantage of an exact duplication of the lines generating noise.

SUMMARY OF THE INVENTION

The object of the present invention is to propose a transmission system of an electrical signal having a limited amplitude spectrum at the frequencies or ranges of frequencies that generate electromagnetic disturbances, and which at the same time does not have the disadvantages spoken of in relation to the prior solutions.

Such object is achieved by a transmission system of the invention.

More specifically, a transmission system of at least one electrical signal to be transmitted by a transmitting electronic device to at least a receiving electronic device, where each electrical signal contains all the information utilisable by the receiving electronic device and has a frequency spectrum which comprises a noise component formed by harmonics suitable to generate electromagnetic disturbances. The transmission system comprises at least a signal line that connects the transmitting electronic device to the at least one receiving electronic device and which is suitable to transmit the respective electrical signal to be transmitted, and a signal generation unit, that generates the electrical signal to be transmitted on each signal line.

The transmission system further comprises at least a noise compensation line, and a noise compensation circuit that generates on each noise compensation line a noise compensation signal having at least one variable component that corresponds, setting aside a multiplication factor, to the inverted of at least a portion of the electrical signal or of the sum of the electrical signals to be transmitted.

The noise compensation signal thus generated emits an electromagnetic radiation around the noise compensation line that cancels or compensates at least in part, the electromagnetic radiation produced by the electrical signal/s to be transmitted.

Consequently, the transmission system according to one aspect of the invention comprises, in addition to the signal lines, at least one noise compensation line. Such noise compensation line, however, does not carry any signal useful for composing the information content utilisable by the receiving device/s. All the information content, in fact, is contained in the signal line/s.

Consequently, according to one aspect of the invention, the noise compensation line is not necessarily connected to the receiving electronic device and may even extend only partially along the at least one signal line.

For example, the noise compensation line may be a shorter length than the signal line. In this case, the noise compensation signal has an amplitude greater than the electrical signal or the sum of the electrical signals to be transmitted.

In other words, the at least one noise compensation line is a line in high impedance disconnected from each receiving electronic device.

In one embodiment, the at least one noise compensation line is composed of an antenna, for example confined in said transmitter device.

According to one aspect of the invention, therefore, the noise compensation circuit may be positioned externally both to the transmitting electronic device and to the at least one receiving electronic device.

According to another aspect of the invention, the noise compensation signal includes a positive constant component the value of which is chosen in such a way that the noise compensation signal never assumes a negative value. This way, the realization of the noise compensation circuit is greatly simplified.

In one embodiment, the noise compensation circuit comprises at least one transistor inverter circuit which receives in input the electrical signal to be transmitted and supplies in output an electrical output signal and an inverter circuit noise compensation signal corresponding to the inverted of the electrical output signal. This way, there is no delay, or there is an insignificant delay between the transmission of the electrical signal to be transmitted and its inverted which is transmitted on the noise compensation line.

In one embodiment, the transmission system comprises at least two signal lines to transmit respective electric signals to be transmitted, and a noise compensation circuit comprising a transistor inverter circuit for each electrical signal to be transmitted, wherein the noise compensation signal is given by the sum of the inverter circuit noise compensation signals present in output of the respective inverter circuits.

As a result, advantageously, a single noise compensation line cancels or compensates at least partially the noise generated by two or more signal lines.

In one embodiment, such a noise compensation circuit is connected to a voltage amplifying device suitable to generate an amplified supply voltage able to polarize in linear zone the transistors of the transistor inverter circuits even when the electrical signals to be transmitted simultaneously assume their highest level.

For example, the voltage amplifying device is implemented with a charge pump.

In one embodiment, the signal line is a data line of a digital bus, the signal generation unit being a bus control unit.

In one embodiment, for example relative to the communication bus "IC2", a clock line of the digital bus is also used, the bus control unit generating on the data line a data signal that switches between a low logic level and a high logic level as a function of the data to be transmitted and to generate on the clock line a clock signal that switches with constant frequency between the low logic level and the high logic level.

In this case, the noise compensation circuit receives the data signal and the clock signal generated by the bus control unit and provides the data line of the digital bus with a data output signal and the clock line of the digital bus with a clock output signal, said data and clock output signals having a logic level corresponding to the logic level of the respective data signal and clock signal. The noise compensation circuit is powered by a constant power supply voltage and comprises:

a. a one-way transistor inverter circuit that receives the clock signal and provides in output the clock output signal and a clock line noise compensation signal corresponding to the inverted of the clock output signal to which the constant supply voltage is added;

b. a two-way transistor inverter circuit which receives the data signal and provides in output the data output signal and a data line noise compensation signal corresponding to the inverted of the data output signal to which the constant supply voltage is added, c. the compensation signal being given by the sum of the noise compensation signal of the clock line with the noise compensation signal of the data line.

BRIEF DESCRIPTION OF THE DRAWINGS

Further characteristics and advantages of the transmission system according to the invention will, in any case, be evident from the description given below of its preferred embodiments, made by way of a non-limiting example with reference to the appended drawings, wherein:

FIG. 1 shows the trend over time of a variable electric signal as a function of the information to be transmitted, for example a PWM signal or an SDA data signal present on a data line of a digital communication bus;

FIG. 1a illustrates the trend over time of a constant square wave signal, for example, the SCL clock signal present on a clock line of a digital communication bus;

FIG. 16 shows schematically a vehicle light comprising electronic devices connected to each other via the digital communication bus according to the invention.

DETAILED DESCRIPTION OF THE INVENTION

Figure 2:
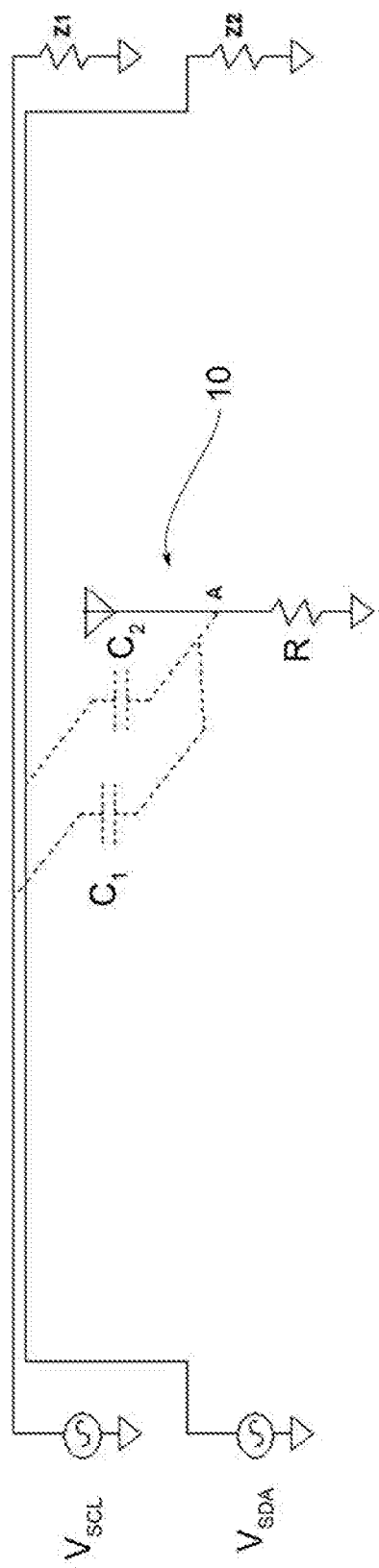
FIG. 2 represents a modelling of a digital communication bus for the purpose of electromagnetic noise generation.

In the description that follows, the elements common to the various embodiments of the invention are indicated using the same reference numerals.

In addition, in the description that follows, the terms "transmitting electronic device" and "receiving electronic device" have been used to indicate that the transmission of a signal is carried out by a device (transmitter) to another (receiver) (or several receiving devices). This does not imply, however, that an electronic device is configured only to transmit or only to receive a signal; on the contrary, in some embodiments described below a transmission line may be two-way, in the sense that a device indicated as a receiver can in turn transmit a signal to the device specified as a transmitter (as in the case of a data signal digital communication bus).

Examples of implementation of the invention in transmission systems will now be described of which, for simplicity, only the lines that generate noise will be considered.

For example, FIG. 1 represents a variable square wave signal, for example as a function of information to be transmitted, which may be for example an SDA data line of a digital communication bus, such as the "IC2" bus or "Lyn" bus, or a PWM ("Pulse Width Modulation" signal).

FIG. 1a shows instead a constant square wave signal, for example, the SCL clock or carrier signal of a digital communication bus.

In the case of a digital bus, the power supply line and the earth line, the voltages of which are substantially constant over time, do not generate any variable electromagnetic field over time, do not contribute to the formation of disturbances and will therefore not be taken into consideration.

Considering for example a digital bus which comprises the data line SDA and the clock line SCL as illustrated in FIG. 2, for the purpose of electromagnetic noise generation, the bus can be modelled by a circuit which comprises an antenna 10 connected by a parasitic capacitance C1; C2 to each of the SDA and SCL lines.

Consequently, on the SDA and SCL lines there are two respective noise sources VSDA and VSCL, represented by variable voltage generators, with respect to earth, different from each other. As a result, the noise sources VSDA and VSCL generate noise during voltage variations, i.e. of the logic states, on the SDA and SCL lines, respectively.

In addition, the SDA and SCL lines end with two respective impedances Z1 and Z2, which represent, for each frequency of the noise spectrum, the impedances heard from the circuit to which the digital bus is connected.

The antenna can be modelled as an R impedance of the resistive type, typically normalized to 50Ω, connected to earth.

It may also be assumed that the parasitic capacitances C1 and C2 are equal, given that the distance between the SDA and SCL lines and the antenna is substantially equal.

The noise voltages VSDA and VSCL vary, for example, between 0 and 5 volts, while the impedances Z1 and Z2 can be identified as an open circuit, given that the frequencies involved are low, the currents on the SDA and SCL lines are very low (in the order of μA) and the input circuits to which the SDA and SCL lines are connected, for example, the input circuits of operational amplifiers, normally have a high impedance at low frequency.

Consequently, the SDA and SCL lines are closed on the antenna by the parasitic capacitance C(=C1=C2), Z1, Z2 being>>C. The current on the lines thus flows through the antenna.

Figure 3:
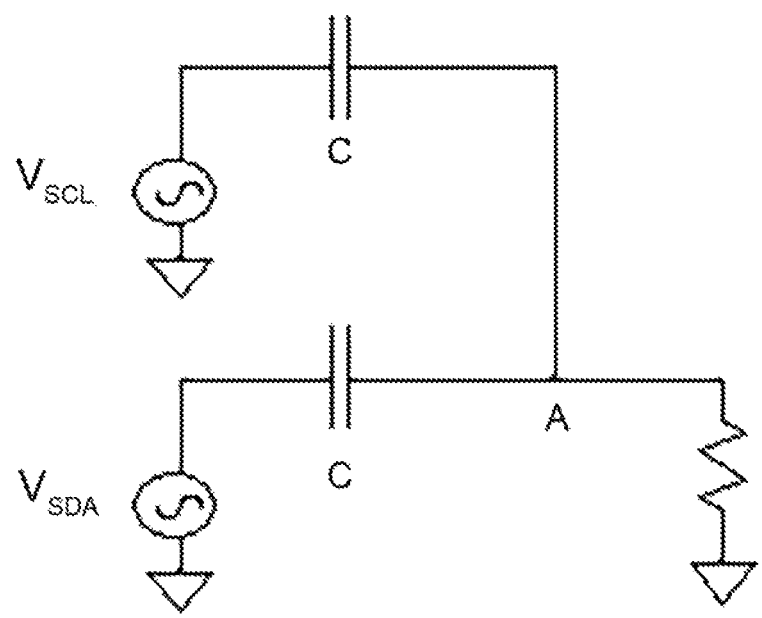
FIG. 3 is a circuit drawing of the modelling in FIG. 2.

In light of the foregoing, the digital bus noise generator circuit can be modelled with the electrical circuit in FIG. 3.

Having defined as VA the voltage felt by the antenna 10, solving such a circuit with the principle of overlapping of effects:

$$V_A = \frac{R}{R + \frac{1}{j\omega C}} \cdot V_1 + \frac{R}{R + \frac{1}{j\omega C}} \cdot V_2 = \frac{j\omega RC}{1 + j\omega RC} \cdot (V_1 + V_2) = K \cdot (V_1 + V_2)$$

It should be noted that the SDA and SCL lines are also connected to the antenna through an inductive component, in addition to the capacitive C; however, at low frequencies, the component of the electric field is far greater than that of the magnetic field and the inductive component can therefore be ignored.

The idea underlying the present invention is to make the voltage VA felt by the antenna equal to 0, so as to cancel the current flowing in the antenna.

In particular, the invention is based on the introduction of a further line in the transmission system, for example in the digital bus, powered via a VOUT compensation voltage source suitable to generate an electromagnetic field able to compensate the electromagnetic field generated by the first and second noise source VSDA and VSCL on the SDA and SCL lines, so that the antenna does not feel any tension at its ends, namely VA=0.

Consequently, the VOUT compensation voltage source must be chosen so that:

$VA=K^*(VSDA+VSCL+VOUT)=0$, from which $VOUT=-(VSDA+VSCL)$.

In accordance with one aspect of the invention, in order to prevent the compensation voltage VOUT from assuming negative values, with a consequent complication of the circuit, a constant offset is added to VOUT, defined by a continuous voltage VBATT. Consequently, VOUT=−(VSDA+VSCL)+VBATT For example, assuming that VSDA and VSCL vary between a minimum value of 0 V and a maximum value of 5 V, and VBATT is equal to 10 V, at such minimum and maximum values of the noise voltages on the SDA and SCL lines, the compensation voltage VOUT will assume the following values:

| $V_{SDA}$ | $V_{SCL}$ | VOUT (with $V_{BATT}$ = 10 V) |
|---|---|---|
| 0 | 0 | 10 |
| 0 | 5 | 5 |
| 5 | 0 | 5 |
| 5 | 5 | 0 |

As will be explained further below, unlike a differential bus, the noise compensation line which is introduced has the sole purpose of compensating the effect of one or more signal lines responsible for the noise and does not carry therefore any useful signal for the purposes of the information content to be transmitted to the receiving device.

In other words, the signal or signals that generate noise carry all the information which must be transmitted to the receiving electronic device.

Therefore, as will be described in more detail below, the noise compensation line need not be connected to both the transmitting and receiving devices, but may be shorter than the signal lines that generate noise or even be in the form of an antenna.

In addition, while the differential communication necessarily involves the generation of negative offset voltages, the transmission system according to the invention can be designed to operate only with voltages greater than or equal to zero.

In one embodiment, in fact, the transmission system according to the invention transmits, together with the signal or signals to be transmitted which generate noise, at least one noise compensation signal having at least one variable component that corresponds, setting aside a multiplication factor, to the inverted of at least a portion of the signal or sum of signals to be transmitted, to which a constant voltage is added.

It is evident that the maximum noise attenuation is achieved with a noise compensation signal having at least one variable component which corresponds, setting aside a multiplication factor, to the inverted of the entire signal or sum of signals to be transmitted.

In some applications, however, it may be sufficient to attenuate part of the noise, for example, a percentage equal to 70-80% of the noise generated by electrical signals to be transmitted. In these cases, the noise compensation signal is obtained by the inversion of a portion of the signal or of the sum of the signals to be transmitted. For example, to construct the noise compensation signal, the transmission system limits itself to elaborating the signal or the sum of the signals to be transmitted within a temporal portion of the time interval in which such signals to be transmitted are generated. For example, in the case of generation of the noise compensation signal by a microprocessor, the microprocessor may perform a sampling of the signals to be transmitted, for example randomly, so as to obtain a portion thereof from which to obtain the inverted signal.

Some practical embodiments of the invention will now be described. It should be noted that the circuit implementation of the idea underlying the invention requires solving the problem, by no means easy, of generating the VOUT signal in a perfectly synchronous manner to the signal to be transmitted, for example V SDA+VSCL. In other words, the signals to be transmitted and the noise compensation signal/s must be transmitted in the transmission system in a synchronous manner, i.e. without the compensation signal having even a minimal delay with respect to the noise generation signals.

According to one embodiment, suitable in particular to compensate the noise generated by a one-way signal, for example an SCL clock signal, a one-way signal compensation circuit 20 is used, known as a "phase-shifter", able to generate an inverted signal without any delay with respect to the non-inverted input signal.

Figure 4:
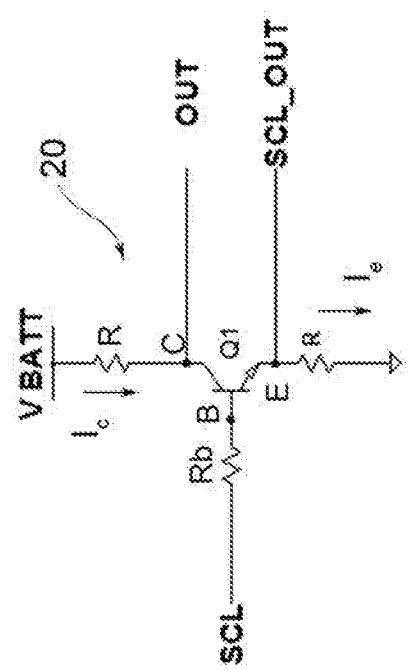
FIG. 4 is a circuit diagram of a noise compensation circuit for an electrical signal to be transmitted of the one-way type, for example an SCL clock signal.

An example of such a circuit applied to the SCL clock signal is shown in FIG. 4.

Below is a table of the states of the signals involved in such circuit:

| $V_{SCL}$ (Volt) | $V_{BE}$ (Volt) | $V_{SCL\_OUT}$ (Volt) | Transistor Q |
|---|---|---|---|
| 0 | 0 | 0 | Cut-out |
| 5 | 0.7 | 4.3 | Polarised in linear zone | where $V_{SCL\_OUT}=V_{SCL}-V_{BE}$, having considered $V_{Rb}$ negligible.

When the transistor Q is polarised in the linear region, the emitter current IE is substantially equal to the collector current IC. Therefore:

$$VOUT \approx VBATT - VSCL\_OUT$$

Therefore, VOUT is the inverted of VSCL_OUT, setting aside the constant voltage VBATT.

Note that the signal VSCL_OUT has a value of 4.3 V, but this approximation is within the tolerances set for the digital bus.

The "phase-shifter" circuit described above is not, however, suitable to transmit a signal in the opposite direction too, so it cannot be used for example for the signal VSDA of a data line to a digital communications bus.

Figure 5:
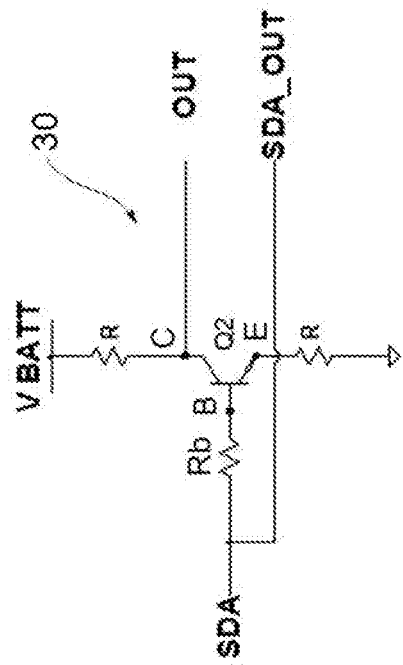
FIG. 5 is a circuit diagram of a noise compensation circuit for an electrical signal to be transmitted of the two-way type, such as an SDA data signal.

For a two-way signal, therefore, the noise compensation circuit of the two-way signal 30 shown in FIG. 5 is used.

If VSDA is equal to zero, the transistor Q2 is cut-out, and therefore VBE=0 e VSDA_OUT=0.

If V SDA=5 V, the transistor Q2 is polarised in the linear region. Consequently, the base-emitter voltage VBE is equal to 0.7 V and V SDA_OUT=5 V.

The emitter current IE is equal to:

$$IE=(VSDA-0.7\text{ V})/R$$

therefore:

$$VOUT=VBATT-R*IC \approx VBATT-R*IE=(VSDA-0.7)==(VBATT-0.7)-VSDA$$

where VOUT is the voltage on the output OUT terminal of the noise compensation circuit 30, namely on the line where the compensation voltage source is present.

In other words, VOUT is the inverted of VSDA, setting aside a constant voltage VBATT.

Figure 6:
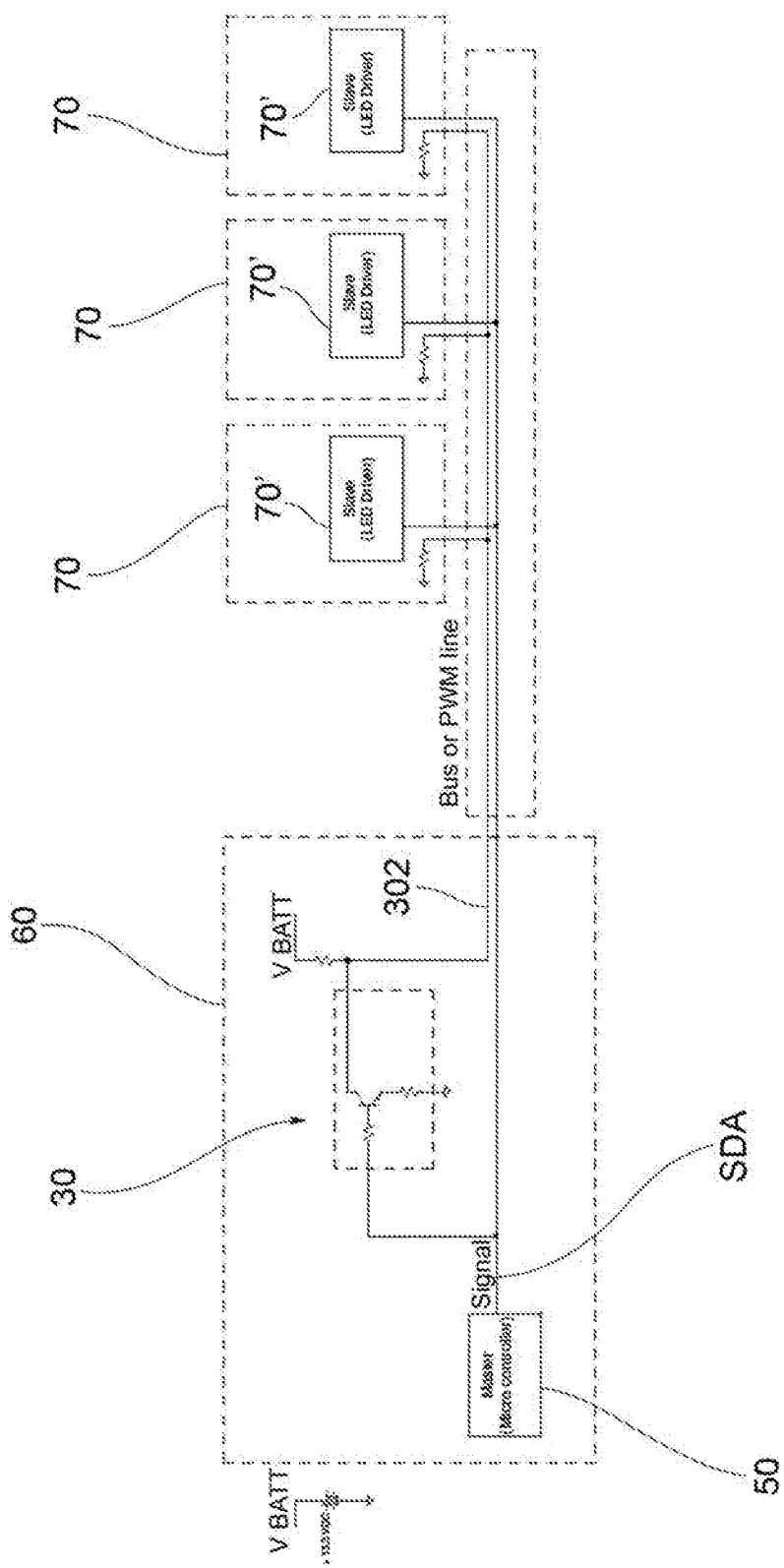
FIG. 6 is a circuit diagram of a transmission system of an electrical signal to be transmitted by a transmitting electronic device to receiving electronic devices, or vice versa, which uses the noise compensation circuit in FIG. 5, in one embodiment.

FIG. 6 is a circuit diagram of a transmission system according to the invention, in one embodiment. The signal to be transmitted on the SDA signal line is generated by a signal generation unit 50, for example a microcontroller, inside the transmitting device 60, for example a control unit of a digital communication bus.

The electrical signal to be transmitted is transmitted through the SDA signal line which is connected to one or more receiving devices 70, in the example illustrated a plurality of LED lighting sources and relative LED drivers 70'.

In this example, the SDA signal line for the signal to be transmitted is a two-way line and the noise compensation circuit of the two-way signal 30, described above and illustrated in FIG. 5 is therefore used.

The transmission system thus comprises, in addition to the SDA signal line, a two-way signal noise compensation line 302, connected to the output OUT of the noise compensation circuit of the two-way signal 30.

In accordance with one aspect of the invention, this two-way signal noise compensation line 302 is a high impedance line. For example, such noise compensation line 302 discharges to earth through a large impedance R6, R7, R8. As a result, the noise compensation signal present on the output terminal OUT of the noise compensation circuit of the two-way signal 30 is a voltage signal which generates an electromagnetic radiation in the surrounding space that cancels or compensates for the electromagnetic interference generated by the SDA signal line.

Since the noise compensation line 302 is not connected to the receiving devices 70, such a line may have a different extension, and in particular lesser, than the signal line. To such purpose, the noise compensation signal amplitude can be multiplied by a factor which depends on the length of the noise compensation line.

Figure 7:
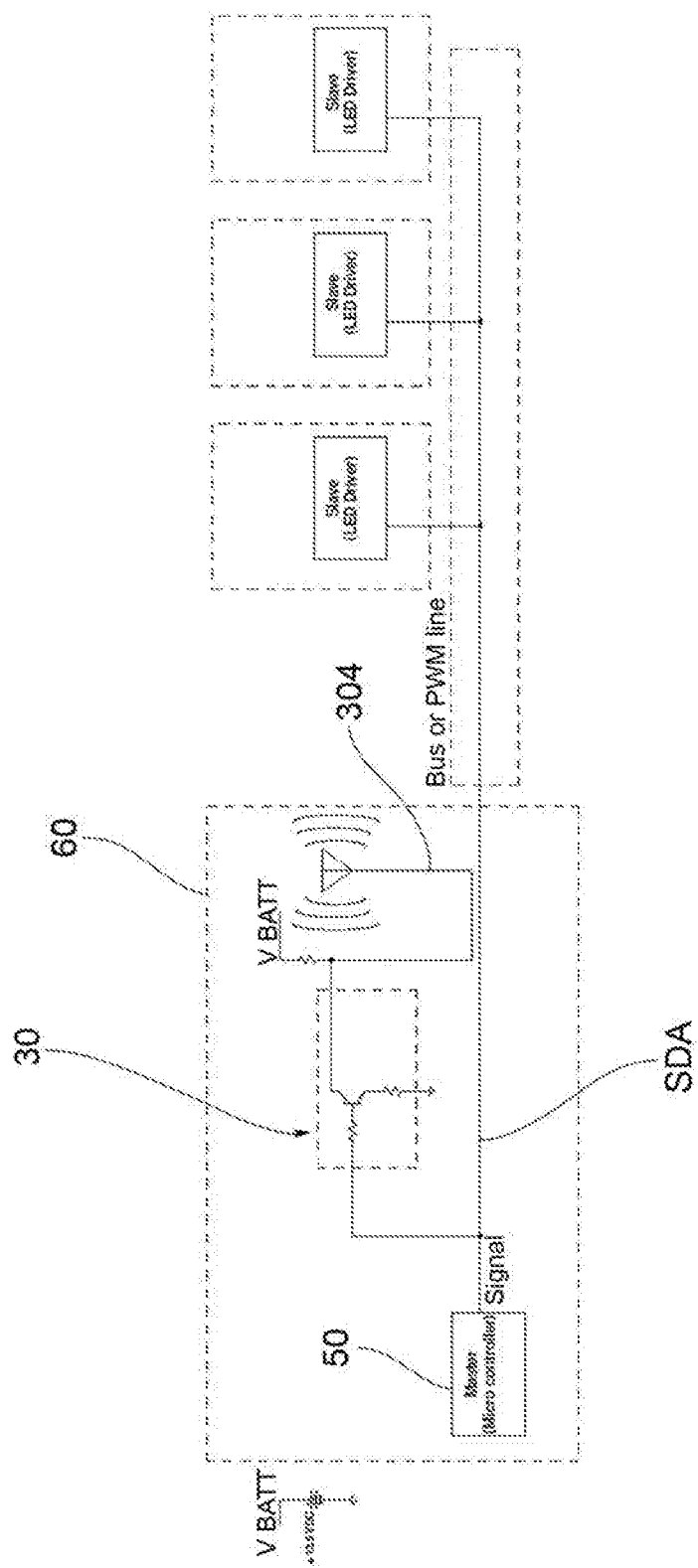
FIG. 7 is a circuit diagram of an embodiment variant of the transmission system in FIG. 6.

In the example in FIG. 7, the noise compensation line is composed of an antenna 304, which may for example even be confined to the transmitting device 60 (if the distance of the receiving devices from the transmitting device is limited).

Figure 8:
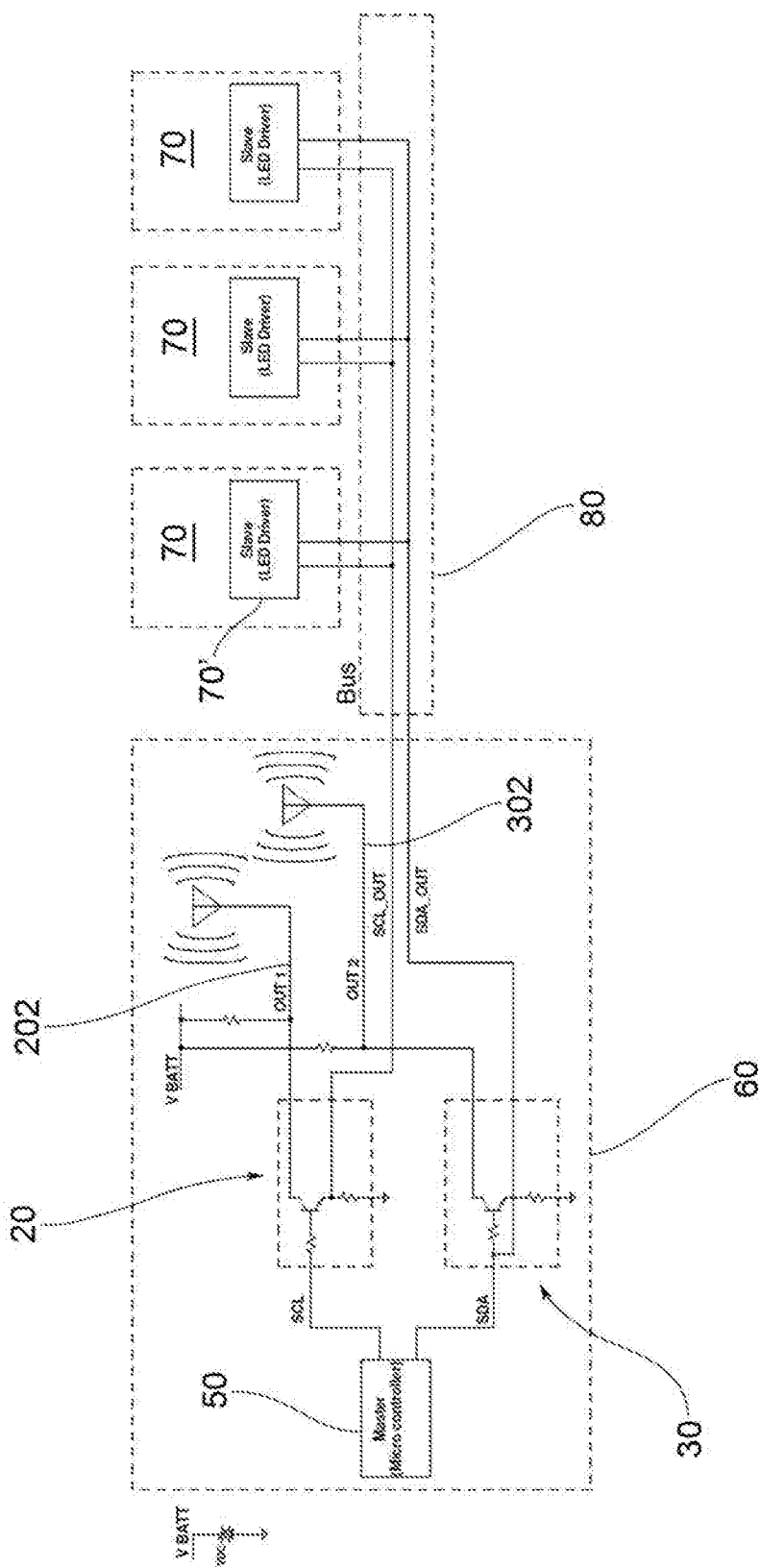
FIG. 8 is a circuit diagram of a transmission system of a data signal and of a clock signal of a digital bus according to the invention, in an embodiment which uses two noise compensation lines.

In the embodiment in FIG. 8, the transmission system is a digital bus 80, for example the bus "I2C", comprising an SDA data line and an SCL clock line. The electrical signals to be transmitted on such lines are generated by signal generation unit 50, for example a microcontroller, inside the control unit 60 of the digital communication bus. The control unit 60 controls the peripheral electronic devices 70 or the receiving devices, connected to the digital communication bus, in the example illustrated a plurality of LED lighting sources and related LED drivers 70'.

In this example, the SDA data line is a two-way line. To compensate for the interference generated by said line the noise compensation circuit of the two-way signal 30 is therefore used. The SCL clock line is a one-way line, and thus to compensate for the noise generated by such line the one-way signal noise compensation circuit 20 is used.

In this case, the digital transmission bus 80 comprises, in addition to the SDA data line and the SCL clock line, two noise compensation lines 202; 302, each connected to the output terminal OUT1; OUT2 of the respective noise compensation circuit 20; 30.

In this case too, each noise compensation line 202, 302 is a high impedance line not connected to the receiving devices 70 and therefore of variable length as needed. As in the example illustrated, each noise compensation line may also be constituted by an antenna, for example confined to the transmitting device 60 (if the distance of the receiving devices from the transmitting device is limited).

Figure 9:
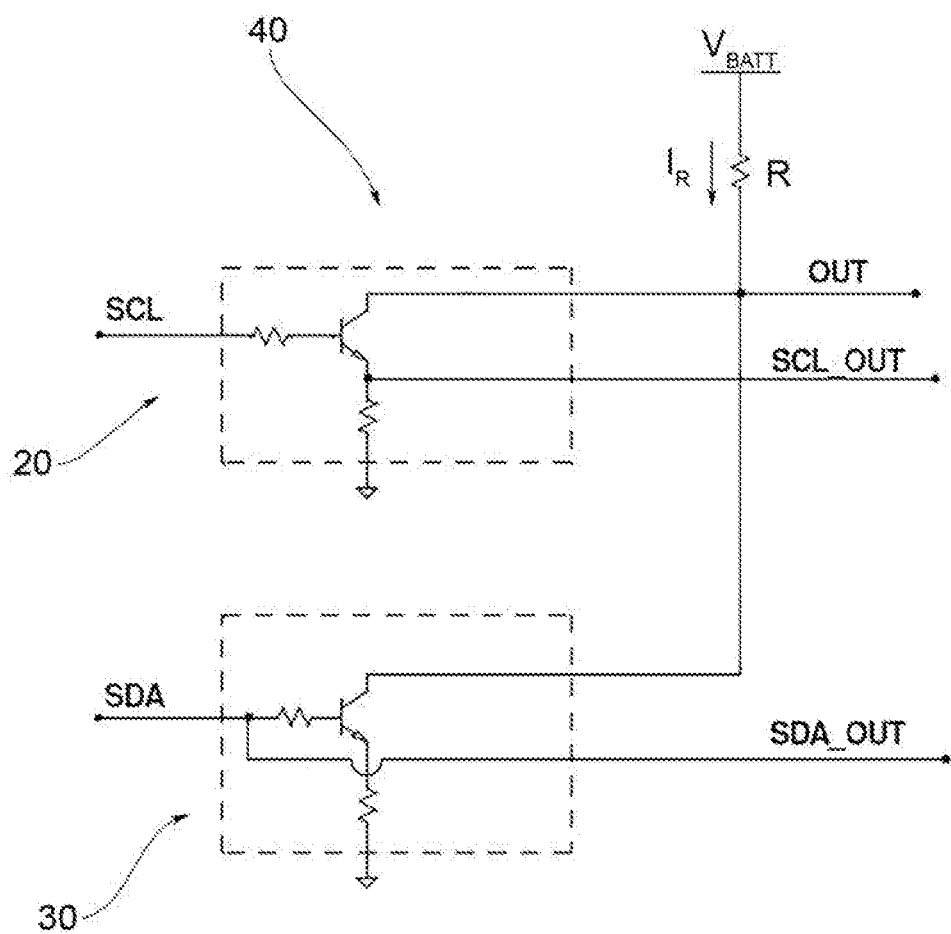
FIG. 9 is a circuit diagram of a noise compensation circuit for a data line and for a clock line of a digital communication bus, which uses a single noise compensation line.

In one embodiment, the one-way signal noise compensation circuit 20 and the two-way signal data compensation circuit 30 are combined so as to form a single combined noise compensation circuit 40 capable of generating the compensation voltage suitable to compensate for the overall noise given by the two SDA and SCL signals. Such combined noise compensation circuit 40 is shown in FIG. 9 and in the circuit diagrams of FIGS. 10-13.

Figures 14, 15:
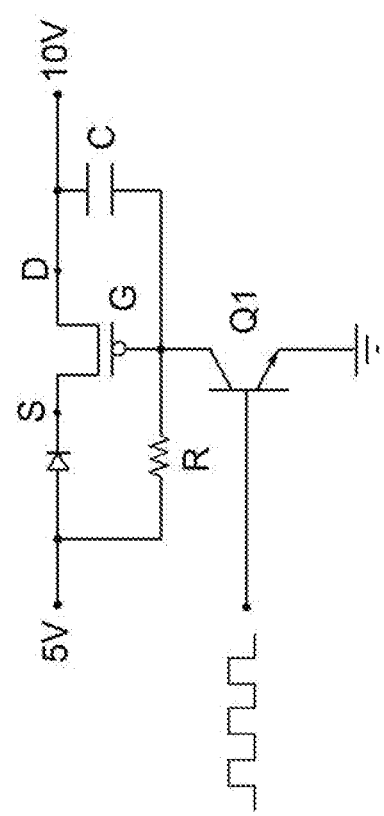
FIG. 14 is a table of the states of the noise compensation circuit in FIG. 9.
FIG. 15 is a circuit diagram of a charge pump utilisable in a digital communication bus according to the invention.

The table in FIG. 14 shows the values of the SCL_OUT clock signals and SDA_OUT data signals transmitted on the bus, along with the noise compensation signal VOUT able to compensate the noise sources associated with the SCL_OUT and SDA_OUT signals.

If VSDA and VSCL are equal to 0, the two transistors Q1 are Q2 are cut-out, so that VOUT=VBATT and VSCL_OUT=VSDA_OUT=0.

If V SDA=0 and V SCL=5V, the emitter current IE1 of the transistor Q1 of the clock signal is:

$$IE1=(VSCL-VBE1)/R=(VSCL-0.7)/R;$$

accordingly, the compensation voltage VOUT is:

$$VOUT=VBATT-R*IC1 \approx VBATT-R*IE1=VBATT-(VSCL-VBE1)=VBATT-VSCL+0.7,$$

while $$VSCL\_OUT=VSCL-VBE1=VSCL-0.7$$

and $VSDA\_OUT=VSDA$.

If VSDA=5 V and VSCL=0, the emitter current IE2 of the transistor Q2 of the compensation circuit of the data line signal is:

$$IE2=(VSDA-VBE2)/R=(VSDA-0.7)/R.$$

Consequently, the compensation voltage VOUT is:

$$VOUT=VBATT-R*IC2 \approx VBATT-R*IE2=VBATT-(VSDA-VBE2)=VBATT-VSDA+0.7,$$

while $$VSCL\_OUT=VSCL=0$$

and $VSDA\_OUT=VSDA=5V$.

If VSDA=5V and VSCL=5V, both transistors of the two compensation circuits are turned on and are polarised in the linear area. By applying the principle of overlapping of effects:

$$IE1=(VSCL-VBE1)/R=(VSCL-0.7)/R;$$

$$IE2=(VSDA-VBE2)/R=(VSDA-0.7)/R,$$

from which $$IR=IC1+IC2 \approx IE1+IE2=(VSCL-0.7)/R+(VSDA-0.7)/R,$$

from which $$VOUT=VBATT-R*IR=VBATT-VSCL-VSDA+1.4,$$

while $$VSCL\_OUT=VSCL-VBE1=VSCL-0.7$$

and $$VSDA\_OUT=VSDA=5V.$$

The compensation of the bus noise is thus given by the sum of the contributions of the noise sources VSDA_OUT+VSCL_OUT with the compensation voltage VOUT, setting aside a constant voltage VBATT.

Thanks to this compensation circuit, the voltage on node A at the ends of the antenna does not vary substantially (setting aside the polarisation voltages of the semiconductor components). In other words, the voltage at node A is substantially equal to 0.

Figure 10:
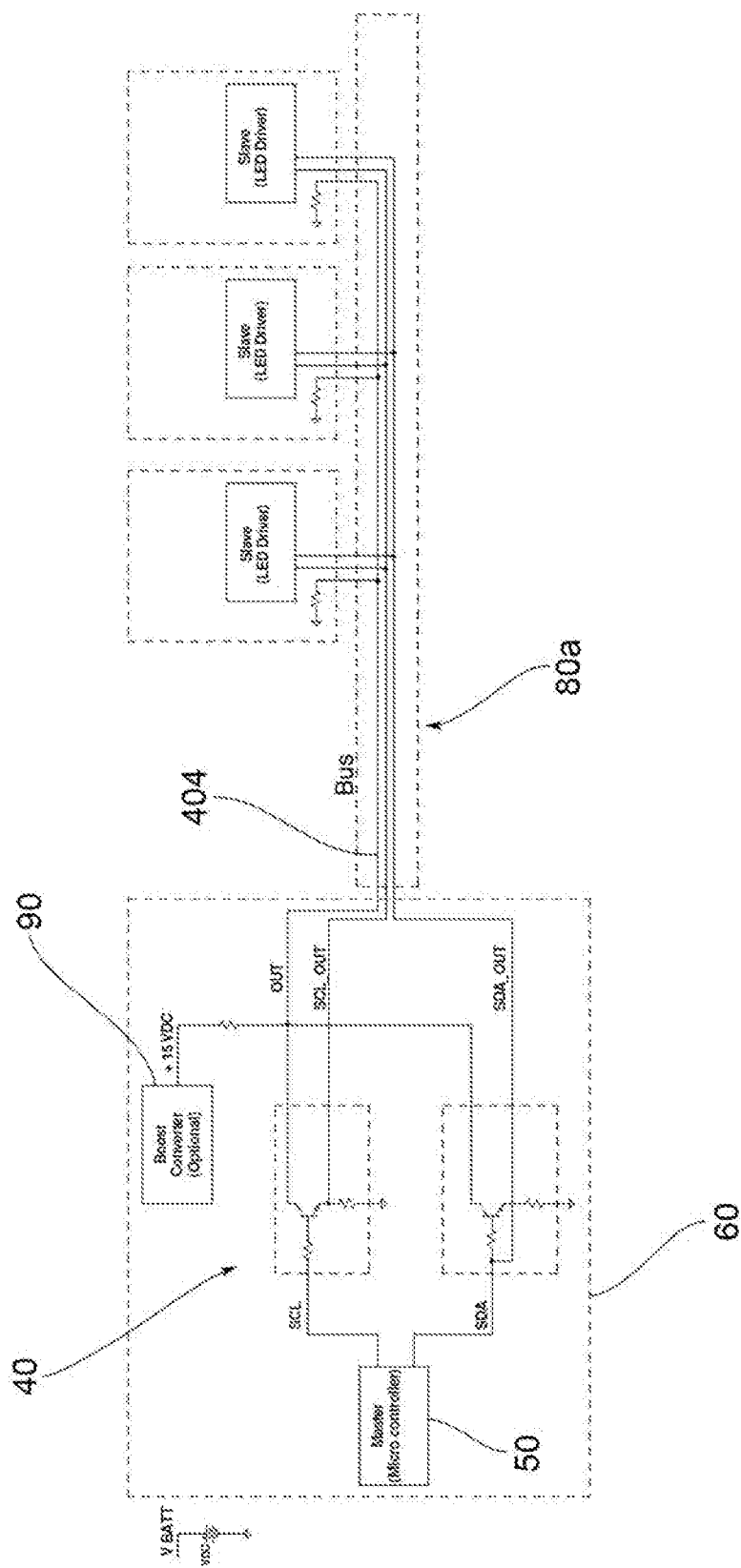
FIG. 10 is a circuit diagram of a digital bus which comprises a data line and a clock line and which uses the noise compensation circuit in FIG. 9, in one embodiment.

The digital transmission bus 80a illustrated in the circuit diagram of FIG. 10 shows the use of a combined noise compensation circuit 40 in place of the two compensation circuits 20, 30 described above. In this case, therefore, the digital communication bus 80a comprises the data output line SDA_OUT (which coincides with the SDA data line in output from the signal generation unit 50), the clock output line SCL_OUT, and a single noise compensation line 404, connected to the output terminal OUT of the combined noise compensation circuit 40.

In the embodiment illustrated in FIG. 10, the combined noise compensation circuit 40 resides in the electronic control unit 60.

However, one of the advantages of the present invention is that said noise compensation circuit 40 could also be implemented indifferently in one of the peripheral devices 70 controlled by the electronic control unit 60 via the digital communication bus, or along the bus itself, in a position between the transmitting device and the receiving devices.

Figure 11:
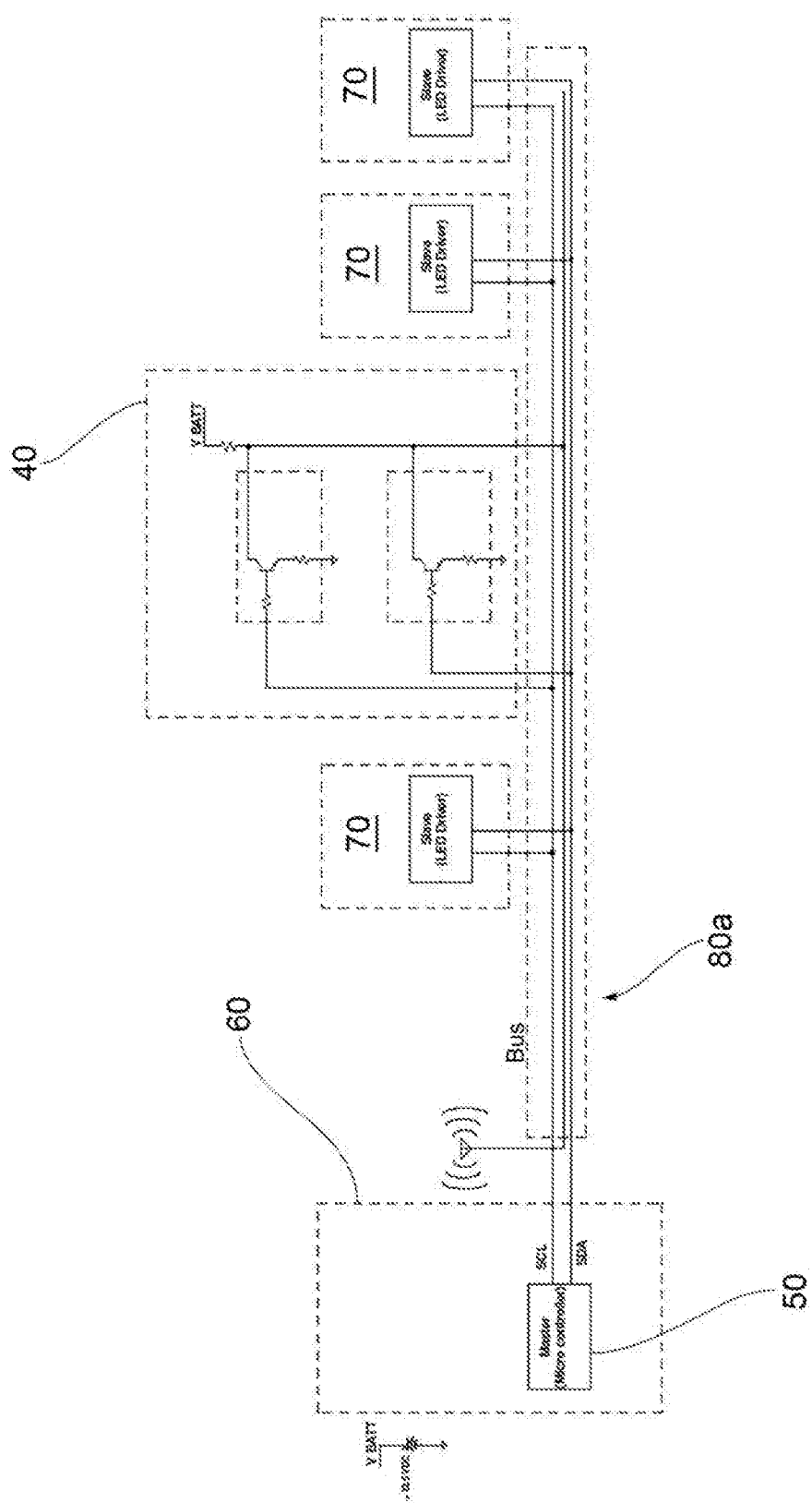
FIG. 11 is a circuit diagram of an embodiment variant of the digital communication bus in FIG. 10.

For example, in the embodiment illustrated in FIG. 11, the noise compensation circuit 40 is made externally to both the electronic transmitting device 60 (the control unit) and to the receiving electronic devices (the peripheral devices 70).

Figure 12:
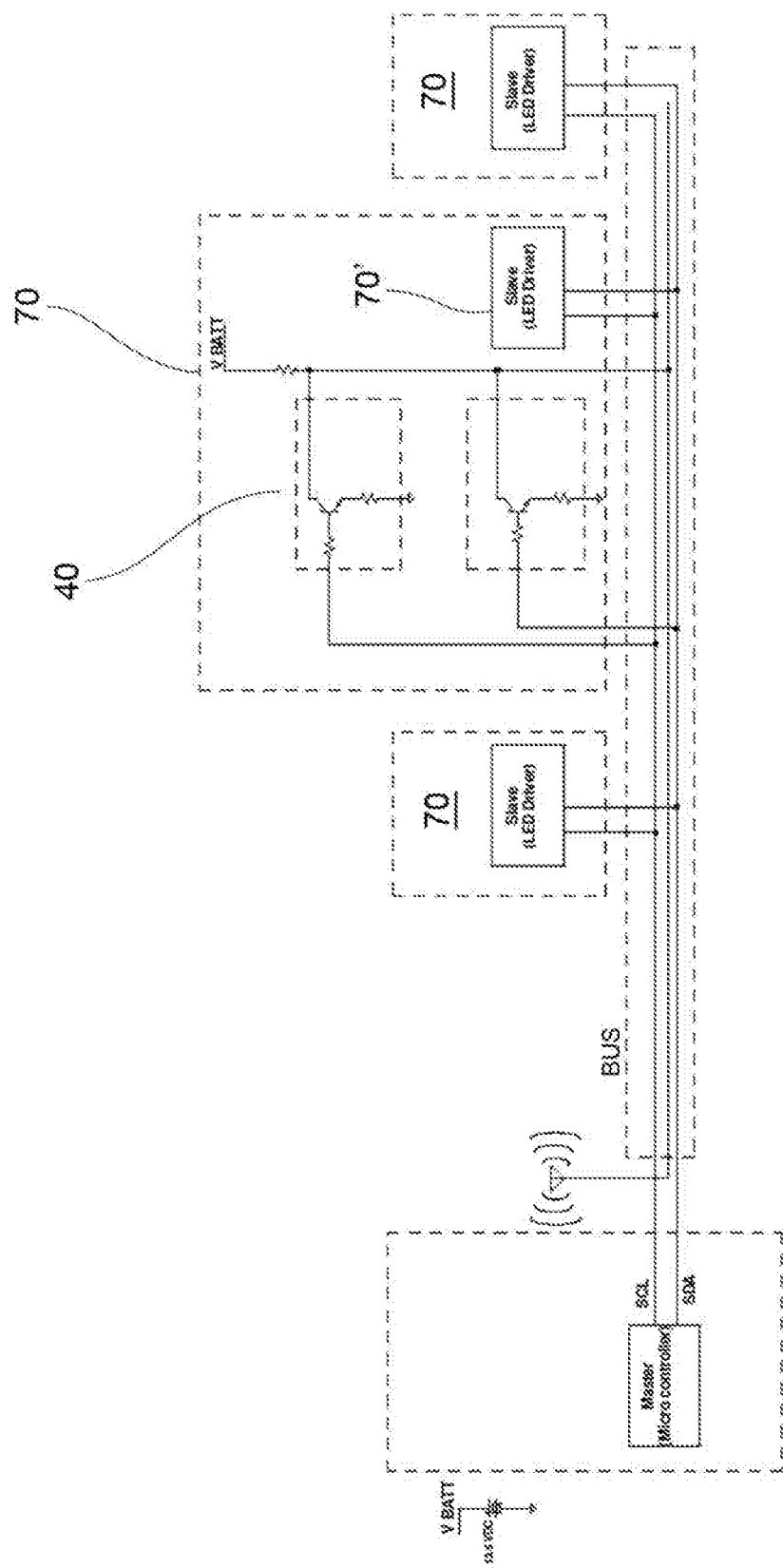
FIG. 12 is a circuit diagram of another alternative embodiment of the digital communication bus in FIG. 10.

In the embodiment illustrated in FIG. 12, the noise compensation circuit 40 is made inside one of the peripheral devices 70.

Of course, this flexibility in the positioning of the noise compensation circuit applies to all the transmission systems described above.

It should be noted that the compensation circuit 40 described above operates correctly when the nominal voltage VBATT which powers the circuit and provides the offset value for the compensation signal is of a level sufficient to polarise the transistors Q1 and Q2 in the linear zone.

For example, when VSCL and VSDA vary between 0 and 5V, the power supply voltage VBATT must be at least 13.5V, in order to still have 3.5V for polarising the transistors.

For lower power supply voltages, between the source of the power supply voltage VBATT and the noise compensation circuit 40, a voltage amplifying device 80 should be introduced suitable to maintain the power supply voltage VBATT at a value such as to polarise the transistors Q1 and Q2 of the compensation circuit.

For example, such amplification device can be made with a DC/DC converter or, more preferably, with a charge pump, of the type illustrated in the circuit diagram in FIG. 15.

The charge pump would be preferable with respect to the DC/DC, since the latter in turn introduces noise.

The charge pump substantially doubles the input voltage.

In the example illustrated, the charge pump comprises a MOS-FET transistor Q2 which doubles the input voltage on its source terminal S. The gate G of the MOS-FET is connected to the source via a resistor R and to the drain through an energy storage capacitor C.

The MOS-FET is driven by a PWM signal, for example through a driver transistor Q1, the collector of which is connected to the gate G of the MOS-FET.

When the driver transistor Q1 is in saturation, the collector C is brought to earth and then the MOS-FET Q2 is brought into saturation and the capacitor C is charged by a diode D, at the input voltage, for example 5V.

When the base of the driver transistor Q1 has a low signal, this transistor goes into cut-out, and so does the MOS-FET Q2. The input voltage is then applied to the negative potential of the capacitor C, which is charged at the input voltage (5V). As a result, in output the charge pump will have an output voltage equal to twice the input voltage, in this case 10V.

By connecting several charge pumps in cascade, the desired values of VBATT can be obtained. For example, with two charge pumps in cascade 20V can be obtained.

The digital communication bus in FIG. 10 uses a compensation circuit 40 equipped with an amplification block 90 of the supply voltage VBATT, able for example to raise the voltage from 13.5V to 15V.

It is to be noted that in the embodiments which instead use a noise compensation line for each line generating noise, each connected to the output terminal of the respective noise compensation circuit, as in the example in FIG. 8, there are no problems of polarization of the transistors of the noise compensation circuits and therefore the voltage amplification devices as described above may not be needed.

Figure 13:
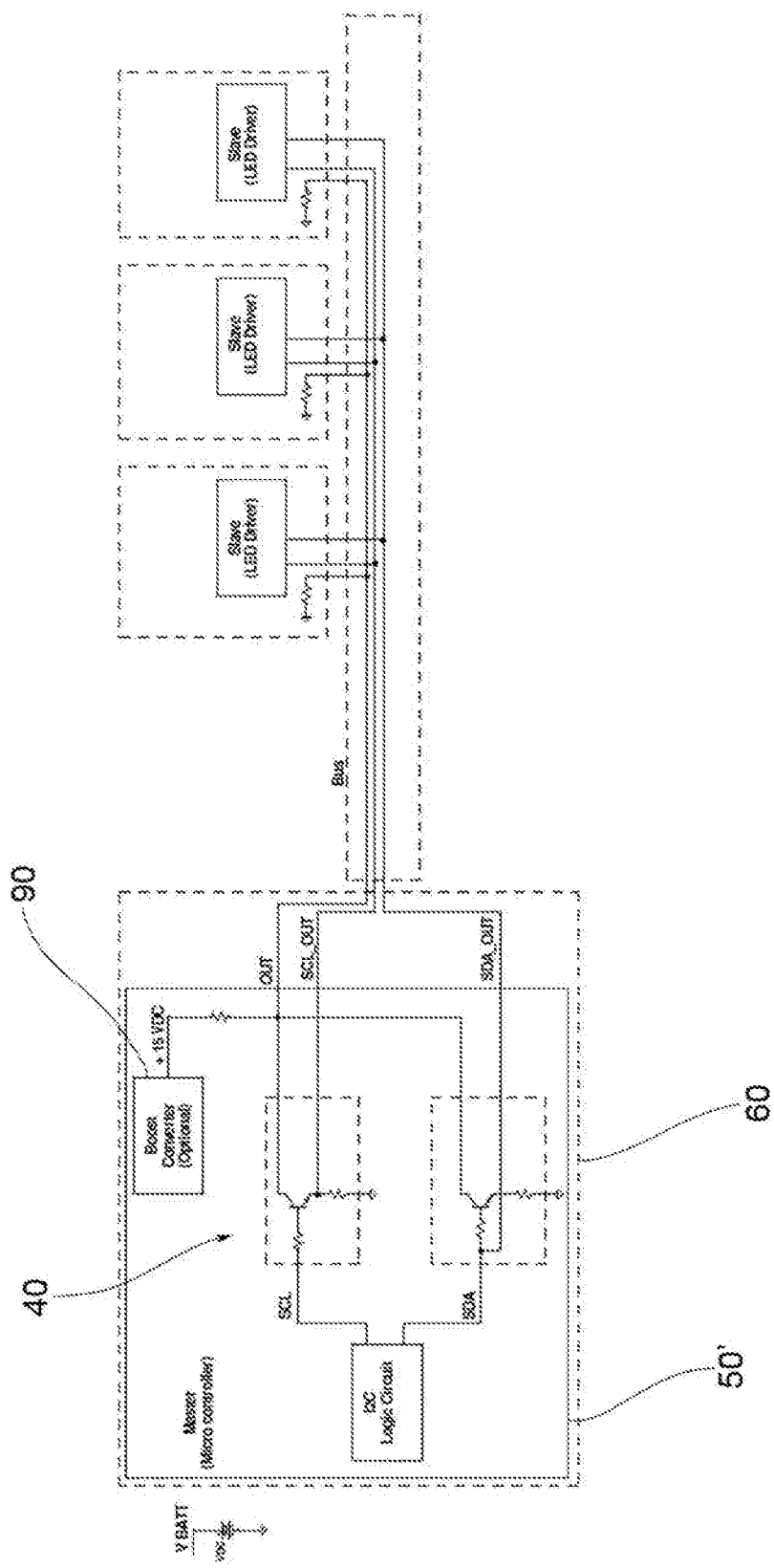
FIG. 13 is a circuit diagram of a further embodiment variant of the digital communication bus in FIG. 10.

In a further variant embodiment schematically represented in FIG. 13, the noise compensation circuit can be implemented with a microcontroller 50' that generates, in addition to the signals to be transmitted, for example, the SCL clock and SDA data signals, also the noise compensation signal/s.

Since everything is integrated in the microcontroller 50', there are no delays between the signals.

For example, for both the SDA and SCL signals, a phase-shifter integrated in the microcontroller can be used.

A further object of the present invention relates to a lighting device, such as a vehicle light 100, comprising an electronic control unit 60, one or more peripheral circuits 70 that each comprise a plurality of LED lighting sources driven by a respective LED driver, for example, but not necessarily, resident on the respective electronic circuit boards, where the electronic control unit 60 controls the peripheral circuits by a digital communication bus 80; 80*a* made according to one of the possible embodiments described above.

A person skilled in the art may make modifications and adaptations to the transmission system according to the invention, replacing elements with others functionally equivalent so as to satisfy contingent requirements while remaining within the scope of protection of the following claims. Each of the characteristics described as belonging to a possible embodiment may be realised independently of the other embodiments described.

The invention claimed is:

1. A transmission system of at least one electrical signal to be transmitted by a transmitting electronic device to at least a receiving electronic device, where each electrical signal contains all the information which must be transmitted to the receiving electronic device and has a frequency spectrum which comprises a noise component formed by harmonics suitable to generate electromagnetic disturbances, the transmission system comprising:
   at least one signal line which connects the transmitting electronic device to the at least one receiving electronic device and which is suitable to transmit the respective electrical signal to be transmitted;
   a signal generation unit, that generates the electrical signal to be transmitted on each signal line;
   at least one noise compensation line;
   a noise compensation circuit that generates on each noise compensation line a noise compensation signal having at least one variable component that corresponds, setting aside a multiplication factor, to the inverted of at least a portion of the electrical signal or of the sum of the electrical signal,
   wherein the noise compensation circuit comprises at least one transistor inverter circuit which receives in input the electrical signal to be transmitted and supplies in output an electrical output signal and an inverter circuit noise compensation signal corresponding to the inverted of the electrical output signal.

2. The transmission system as set forth in claim 1, wherein the at least one noise compensation line extends at least partially along the at least one signal line.

3. The transmission system as set forth in claim 2, wherein the noise compensation line has a shorter length than the signal line.

4. The transmission system as set forth in claim 3, wherein each noise compensation signal has an amplitude greater than the electrical signal or the sum of the electrical signals to be transmitted.

5. The transmission system as set forth in claim 1, wherein the at least one noise compensation line is a line in high impedance disconnected from each receiving electronic device.

6. The transmission system as set forth in claim 1, wherein the at least one noise compensation line is constituted by an antenna.

7. The transmission system as set forth in claim 1, wherein the noise compensation circuit is positioned externally both to the transmitting electronic device and to the at least one receiving electronic device.

8. The transmission system as set forth in claim 1, wherein the electrical signal to be transmitted is a square wave or a Dirac pulse signal.

9. The transmission system as set forth in claim 1, wherein the noise compensation signal includes a positive constant component the value of which is chosen in such a way that the noise compensation signal never assumes a negative value.

10. The transmission system as set forth in claim 1, wherein the noise compensation circuit is powered by a constant power supply voltage and wherein the noise compensation signal is added to the constant power supply voltage.

11. The transmission system as set forth in claim 1, comprising at least two signal lines to transmit respective electric signals to be transmitted, a noise compensation circuit comprising a transistor inverter circuit for each electrical signal to be transmitted, wherein the noise compensation signal is given by the sum of the inverter circuit noise compensation signals present in output of the respective inverter circuits.

12. The transmission system as set forth in claim 11, wherein the noise compensation circuit is connected to a voltage amplifying device suitable to generate an amplified supply voltage able to polarize in linear zone the transistors of the transistor inverter circuits even when the electrical signals to be transmitted simultaneously assume their highest level.

13. The transmission system as set forth in claim 12, wherein the voltage amplifying device is implemented with a charge pump.

14. The transmission system as set forth in claim 1, wherein the signal line is a data line of a digital bus and wherein the signal generation unit is a bus control unit.

15. The transmission system as set forth in claim 14, further comprising a clock line of the digital bus, the bus control unit generating on the data line a data signal that switches between a low logic level and a high logic level as a function of the data to be transmitted and to generate on the clock line a clock signal that switches with constant frequency between the low logic level and the high logic level.

16. The transmission system as set forth in claim 15, wherein the noise compensation circuit receives the data signal and the clock signal generated by the bus control unit and provides the data line of the digital bus with a data output signal and the clock line of the digital bus with a clock output signal, said data and clock output signals having a logic level corresponding to the logic level of the respective data signal and clock signal and wherein the noise compensation circuit is powered by a constant power supply voltage and comprises:
 a one-way transistor inverter circuit that receives the clock signal and provides in output the clock output signal and a clock line noise compensation signal corresponding to the negation of the clock output signal to which the constant supply voltage is added;
 a two-way transistor inverter circuit which receives the data signal and provides in output the data output signal and a data line noise compensation signal corresponding to the negation of the data output signal to which the constant supply voltage is added,
the compensation signal being given by the sum of the noise compensation signal of the clock line with the noise compensation signal of the data line.

17. The transmission system as set forth in claim 14, wherein the bus control unit is a microcontroller unit, and wherein the noise compensation circuit is implemented outside the microcontroller.

18. The transmission system as set forth in claim 14, wherein the bus control unit is a microcontroller unit, and wherein the noise compensation circuit is implemented inside the microcontroller.

19. An assembly comprising a first electronic device, at least a second electronic device and a transmission system of an electrical signal to be transmitted between the first electronic device and the at least one second electronic device as set forth in claim 1.

20. The assembly as set forth in claim 19, wherein the noise compensation line is disconnected from the second electronic device and/or from the first electronic device.

21. The assembly as set forth in claim 19, wherein both the signal generation unit and the noise compensation circuit are made in the first electronic device.

22. The assembly as set forth in claim 19, wherein the noise compensation circuit is made in a second electronic device or in an intermediate point of the noise compensation line.

23. A vehicle light comprising an electronic control unit, one or more peripheral circuits which each comprise a plurality of LED lighting sources driven by a respective LED driver, wherein the electronic control unit controls the peripheral circuits via a digital communication bus based on a signal communication system as set forth in claim 1.

* * * * *

UNITED STATES PATENT AND TRADEMARK OFFICE
CERTIFICATE OF CORRECTION

PATENT NO. : 10,623,210 B2
APPLICATION NO. : 16/209200
DATED : April 14, 2020
INVENTOR(S) : Alessandro Brisotto et al.

It is certified that error appears in the above-identified patent and that said Letters Patent is hereby corrected as shown below:

In the Claims

Column 12, Line 24 (Claim 1) delete "signal," and insert therefor --signals,--.

Signed and Sealed this
Twenty-seventh Day of October, 2020

Andrei Iancu
*Director of the United States Patent and Trademark Office*